United States Patent
Chen et al.

(10) Patent No.: US 9,966,505 B2
(45) Date of Patent: May 8, 2018

(54) LIGHT EMITTING STRUCTURE, LIGHT DEVICE AND BACKLIGHT MODULE

(71) Applicant: Lextar Electronics Corporation, Hsinchu (TW)

(72) Inventors: Ching-Yi Chen, New Taipei (TW); Hung-Chun Tong, New Taipei (TW); Li-Cheng Yang, Taoyuan (TW); Wen-Wan Tai, Kaohsiung (TW); Yu-Chun Lee, Hsinchu County (TW); Tzong-Liang Tsai, Taichung (TW)

(73) Assignee: Lextar Electronics Corporation (TW)

( * ) Notice: Subject to any disclaimer, the term of this patent is extended or adjusted under 35 U.S.C. 154(b) by 272 days.

(21) Appl. No.: 14/887,451

(22) Filed: Oct. 20, 2015

(65) Prior Publication Data

US 2016/0365491 A1 Dec. 15, 2016

(30) Foreign Application Priority Data

Jun. 10, 2015 (TW) .............................. 104118794 A

(51) Int. Cl.
*H01L 33/50* (2010.01)
*F21V 8/00* (2006.01)

(52) U.S. Cl.
CPC .......... *H01L 33/504* (2013.01); *G02B 6/0035* (2013.01); *G02B 6/0073* (2013.01); *G02B 6/0003* (2013.01)

(58) Field of Classification Search
CPC ... H01L 33/504; G02B 6/0073; G02B 6/0035; G02B 6/003
See application file for complete search history.

(56) References Cited

U.S. PATENT DOCUMENTS

| | | | |
|---|---|---|---|
| 7,618,157 B1 | 11/2009 | Galvez et al. | |
| 8,882,284 B2 | 11/2014 | Tong et al. | |
| 2006/0099449 A1 | 5/2006 | Amano et al. | |
| 2006/0220531 A1 | 10/2006 | Tokunaga et al. | |
| 2011/0025951 A1 | 2/2011 | Jones | |
| 2012/0113672 A1 | 5/2012 | Dubrow et al. | |

(Continued)

FOREIGN PATENT DOCUMENTS

| | | |
|---|---|---|
| EP | 2417219 A1 | 2/2012 |
| TW | I233312 B | 5/2005 |

(Continued)

*Primary Examiner* — David V Bruce
(74) *Attorney, Agent, or Firm* — Hayes Soloway PC

(57) ABSTRACT

The present disclosure provides a light emitting structure including a blue light source, a first fluorescent material layer and a second fluorescent material layer. The blue light source has a light emitting surface. The first fluorescent material layer covers the light emitting surface of the blue light source. The first fluorescent material layer consists of a first fluorescent material. An excitation band of the first fluorescent material is in a blue wave band, and an emission band of the first fluorescent material is in a green wave band. The second fluorescent material layer covers the first fluorescent material layer. The second fluorescent material layer consists of a second fluorescent material. An excitation band of the second fluorescent material is in a green wave band, and an emission band of the second fluorescent material is in a red wave band. A light device and a backlight module are also provided herein.

22 Claims, 9 Drawing Sheets

(56) References Cited

U.S. PATENT DOCUMENTS

| | | |
|---|---|---|
| 2013/0235555 A1 | 9/2013 | Tanaka |
| 2013/0335677 A1 | 12/2013 | You |
| 2014/0021857 A1 | 1/2014 | Van Bommel et al. |
| 2014/0077247 A1* | 3/2014 | Hikmet ................ H01L 33/504 257/98 |
| 2014/0168943 A1 | 6/2014 | Peeters et al. |
| 2014/0367713 A1 | 12/2014 | Zhang et al. |

FOREIGN PATENT DOCUMENTS

| | | |
|---|---|---|
| TW | 200709461 | 3/2007 |
| TW | M351452 U | 2/2009 |
| TW | 201306328 A | 2/2013 |
| TW | 201409762 A | 3/2014 |
| WO | 2014123724 A1 | 8/2014 |
| WO | 2015036224 A1 | 3/2015 |

* cited by examiner

LIGHT EMITTING STRUCTURE, LIGHT DEVICE AND BACKLIGHT MODULE

RELATED APPLICATIONS

This application claims priority to Taiwanese Application Serial Number 104118794, filed Jun. 10, 2015, which is herein incorporated by reference.

BACKGROUND

Field of Invention

The present disclosure relates to a package structure of a light emitting diode. More particularly, the present disclosure relates to a package structure of a white light emitting diode and a white light emitting diode device.

Description of Related Art

Nowadays, technologies of producing a white light emitting diode have been quite matured. The white light emitting diode is applied to various light emitting devices to replace a traditional incandescent bulb and a fluorescent tube, and the white light emitting diode becomes a high brightness and energy saving white light source. The white light emitting diode generally consists of a blue light emitting diode chip and a fluorescent plastic material layer.

In the fluorescent plastic material layer, a fluorescent particle emitting green light and a fluorescent particle emitting red light are dispersed uniformly in a transparent plastic material. When the blue light emitting diode chip emits blue light, both the fluorescent particle emitting green light and the fluorescent particle emitting red light absorbs energy from a blue wave band. The energy is then transferred to excite a green light and a red light. The light emits from the fluorescent plastic material layer including the red light, the green light and the blue light, and the light emits from a point light source. Therefore, the red light, the green light and the blue light are combined to form a white light.

However, due to different characteristics (e.g. a particle size, a density of the particle, and a shape of the particle) of the fluorescent particles, an effect of mutual absorption occurs between the fluorescent particle emitting green light and the fluorescent particle emitting red light when the fluorescent particle emitting green light and the fluorescent particle emitting red light are mixed and dispersed in the transparent plastic material. The effect of mutual absorption decreases a light emitting efficiency of the white light emitting diode, and increases complexity of producing the white light emitting diode. Therefore, a new light emitting structure is needed to overcome the problems of the traditional white light emitting diode.

SUMMARY

In view of problems of the prior arts, the present disclosure discloses a new light emitting structure, a light device and a backlight module having the same. A fluorescent material layer emitting a green light and a fluorescent material layer emitting a red light orderly cover a light emitting surface of a blue light source of the light emitting structure. The fluorescent material layer emitting the green light and the fluorescent material layer emitting the red light provided by the present disclosure are independently disposed in the light emitting structure, thus an effect of mutual absorption between a fluorescent particle emitting the green light and a fluorescent particle emitting the red light in the prior structure is prevented. On the other hand, the fluorescent material layer emitting the green light absorbs a blue light and excites the green light, and the fluorescent material layer emitting the red light absorbs the green light and excites the red light, thus a reabsorption effect resulting from absorbing the same wave band of a color light is prevented.

One aspect of the present disclosure is to provide a light emitting structure. The light emitting structure includes a blue light source, a first fluorescent material layer and a second fluorescent material layer. The blue light source has a light emitting surface. The first fluorescent material layer covers the light emitting surface of the blue light source. The first fluorescent material layer consists of a first fluorescent material, an excitation band of the first fluorescent material is in a blue wave band, and an emission band of the first fluorescent material is in a green wave band. The second fluorescent material layer covers the first fluorescent material layer. The second fluorescent material layer consists of a second fluorescent material, an excitation band of the second fluorescent material is in the green wave band, and an emission band of the second fluorescent material is in a red wave band.

According to one embodiment of the present disclosure, an emission band of the blue light source is partially overlapped with the excitation band of the first fluorescent material, and the emission band of the first fluorescent material is partially overlapped with the excitation band of the second fluorescent material.

According to one embodiment of the present disclosure, the emission band of the blue light source is 350 nm to 470 nm.

According to one embodiment of the present disclosure, the blue light source includes a blue light emitting diode chip or a blue organic light emitting diode chip.

According to one embodiment of the present disclosure, the blue light emitting diode chip or the blue organic light emitting diode chip includes a horizontal light emitting diode chip, a vertical light emitting diode chip or a flip-chip light emitting diode chip.

According to one embodiment of the present disclosure, the excitation band of the first fluorescent material is 350 nm to 480 nm, and the emission band of the first fluorescent material is 510 nm to 580 nm.

According to one embodiment of the present disclosure, the first fluorescent material is an inorganic fluorescent material selected from the group consisting of lutetium yttrium aluminum garnet (LuYAG), gallium-substituted yttrium aluminum garnet (GaYAG), yttrium aluminum garnet (YAG), a silicate, a sulfide, a nitride, a quantum dot material and a combination thereof.

According to one embodiment of the present disclosure, the excitation band of the second fluorescent material is 500 nm to 600 nm, and the emission band of the second fluorescent material is 600 nm to 780 nm.

According to one embodiment of the present disclosure, the second fluorescent material is an organic fluorescent material, the organic fluorescent material is an organic compound having a functional group selected from the group consisting of a perylene group, a benzimidazole group, a naphthalene group, an anthracene group, a phenanthrene group, a fluorene group, a 9-fluorenone group, a carbazole group, a glutarimide group, a 1,3-diphenylbenzene group, a benzopyrene group, a pyrene group, a pyridine group, a thiophene group, a 2,3-dihydro-1H-benzo[de]isoquinoline-1,3-dione group, and the organic compound comprises a single molecule structure, a polymolecule structure, an oligomer, a polymer and a combination thereof.

According to one embodiment of the present disclosure, the light emitting structure further includes a substrate, in which the blue light source is disposed on the substrate.

According to one embodiment of the present disclosure, the light emitting structure further includes a transparent packaging plastic material layer covering the second fluorescent material layer.

According to one embodiment of the present disclosure, a material of the transparent packaging plastic material layer is selected from the group consisting of polymethylmethacrylate (PMMA), polyethylene terephthalate (PET), polystyrene (PS), polypropylene (PP), polyamide (PA), polycarbonate (PC), an epoxy resin, silicone and a combination thereof.

According to one embodiment of the present disclosure, the light emitting structure further includes a light-tight packaging plastic material layer disposed on the substrate and surrounding the blue light source.

According to one embodiment of the present disclosure, the light-tight packaging plastic material layer includes a base and a pigment dispersed in the base, a material of the base is selected from the group consisting of polymethylmethacrylate (PMMA), polyethylene terephthalate (PET), polystyrene (PS), polypropylene (PP), polyamide (PA), polycarbonate (PC), an epoxy resin, silicone and a combination thereof.

The other aspect of the present disclosure is to provide a light device. The light device includes a light bar and a fluorescent lampshade.

The light bar includes a circuit board and at least one light emitting structure. The light emitting structure is disposed on and electrically connected to the circuit board, and the light emitting structure includes a blue light source and a fluorescent plastic material layer. The blue light source has a light emitting surface. The fluorescent plastic material layer covers the light emitting surface of the blue light source. The fluorescent plastic material layer includes a transparent plastic material and a first fluorescent material dispersed in the transparent plastic material, in which an excitation band of the first fluorescent material is in a blue wave band, and an emission band of the first fluorescent material is in a green wave band.

The fluorescent lampshade covers the light bar. The fluorescent lampshade includes a lampshade body and a second fluorescent material dispersed in the lampshade body. An excitation band of the second fluorescent material is in the green wave band, and an emission band of the second fluorescent material is in a red wave band.

According to one embodiment of the present disclosure, an emission band of the blue light source is partially overlapped with the excitation band of the first fluorescent material, and the emission band of the first fluorescent material is partially overlapped with the excitation band of the second fluorescent material.

According to one embodiment of the present disclosure, the emission band of the blue light source is 350 nm to 470 nm.

According to one embodiment of the present disclosure, the blue light source includes a blue light emitting diode or a blue organic light emitting diode.

According to one embodiment of the present disclosure, the blue light emitting diode or the blue organic light emitting diode includes a horizontal light emitting diode, a vertical light emitting diode or a flip-chip light emitting diode.

According to one embodiment of the present disclosure, the excitation band of the first fluorescent material is 350 nm to 480 nm, and the emission band of the first fluorescent material is 510 nm to 580 nm.

According to one embodiment of the present disclosure, the first fluorescent material is an inorganic fluorescent material selected from the group consisting of LuYAG, GaYAG, YAG, a silicate, a sulfide, a nitride, a quantum dot material and a combination thereof.

According to one embodiment of the present disclosure, the excitation band of the second fluorescent material is 500 nm to 600 nm, and the emission band of the second fluorescent material is 600 nm to 780 nm.

According to one embodiment of the present disclosure, the second fluorescent material is an organic fluorescent material, the organic fluorescent material is an organic compound having a functional group selected from the group consisting of a perylene group, a benzimidazole group, a naphthalene group, an anthracene group, a phenanthrene group, a fluorene group, a 9-fluorenone group, a carbazole group, a glutarimide group, a 1,3-diphenylbenzene group, a benzopyrene group, a pyrene group, a pyridine group, a thiophene group, a 2,3-dihydro-1H-benzo[de]isoquinoline-1,3-dione group, and the organic compound comprises a single molecule structure, a polymolecule structure, an oligomer, a polymer and a combination thereof.

According to one embodiment of the present disclosure, the transparent plastic material and a material of the lampshade body are independently selected from the group consisting of polymethylmethacrylate (PMMA), polyethylene terephthalate (PET), polystyrene (PS), polypropylene (PP), polyamide (PA), polycarbonate (PC), an epoxy resin, silicone and a combination thereof.

According to one embodiment of the present disclosure, the light device further includes a pair of conductive supporting members, electrically connected to the light emitting structure and the circuit board.

According to one embodiment of the present disclosure, the pair of the conductive supporting members is two metal sheets, each of which is connected to one of two electrodes of the light emitting structure respectively, thereby forming a plug-in light emitting diode.

According to one embodiment of the present disclosure, the plug-in light emitting diode is directly plugged in and electrically connected to the circuit board.

Another aspect of the present disclosure is to provide a backlight module. The backlight module includes an optical device, a light emitting structure and a fluorescent material layer.

The optical device has an incident surface and a light emitting surface. The light emitting structure emits light toward the incident surface of the optical device, and the light emitting structure includes a blue light source and a fluorescent plastic material layer. The blue light source has a light emitting surface. The fluorescent plastic material layer covers the light emitting surface of the blue light source. The fluorescent plastic material layer includes a transparent plastic material and a first fluorescent material dispersed in the transparent plastic material. An excitation band of the first fluorescent material is in a blue wave band, and an emission band of the first fluorescent material is in a green wave band.

The fluorescent material layer covers the light emitting surface of the optical device, and the fluorescent material layer includes a second fluorescent material. An excitation band of the second fluorescent material is in the green wave band, and an emission band of the second fluorescent material is in a red wave band.

According to one embodiment of the present disclosure, the optical device includes a light guide plate, a lens or a combination thereof.

According to one embodiment of the present disclosure, the incident surface and the light emitting surface of the light guide plate are adjacent to or opposite to each other.

According to one embodiment of the present disclosure, the lens is a secondary optical lens, and the fluorescent material layer covers the light emitting surface of the secondary optical lens.

According to one embodiment of the present disclosure, an emission band of the blue light source is partially overlapped with the excitation band of the first fluorescent material, and the emission band of the first fluorescent material is partially overlapped with the excitation band of the second fluorescent material.

According to one embodiment of the present disclosure, the emission band of the blue light source is 350 nm to 470 nm.

According to one embodiment of the present disclosure, the blue light source includes a blue light emitting diode chip or a blue organic light emitting diode chip.

According to one embodiment of the present disclosure, the blue light emitting diode chip or the blue organic light emitting diode chip includes a horizontal light emitting diode chip, a vertical light emitting diode chip or a flip-chip light emitting diode chip.

According to one embodiment of the present disclosure, the excitation band of the first fluorescent material is 350 nm to 480 nm, and the emission band of the first fluorescent material is 510 nm to 580 nm.

According to one embodiment of the present disclosure, the first fluorescent material is an inorganic fluorescent material selected from the group consisting of LuYAG, GaYAG, YAG, a silicate, a sulfide, a nitride, a quantum dot material and a combination thereof.

According to one embodiment of the present disclosure, the excitation band of the second fluorescent material is 500 nm to 600 nm, and the emission band of the second fluorescent material is 600 nm to 780 nm.

According to one embodiment of the present disclosure, the second fluorescent material is an organic fluorescent material, the organic fluorescent material is an organic compound having a functional group selected from the group consisting of a perylene group, a benzimidazole group, a naphthalene group, an anthracene group, a phenanthrene group, a fluorene group, a 9-fluorenone group, a carbazole group, a glutarimide group, a 1,3-diphenylbenzene group, a benzopyrene group, a pyrene group, a pyridine group, a thiophene group, a 2,3-dihydro-1H-benzo[de]isoquinoline-1,3-dione group, and the organic compound comprises a single molecule structure, a polymolecule structure, an oligomer, a polymer and a combination thereof.

According to one embodiment of the present disclosure, the transparent plastic material is selected from the group consisting of polymethylmethacrylate (PMMA), polyethylene terephthalate (PET), polystyrene (PS), polypropylene (PP), polyamide (PA), polycarbonate (PC), an epoxy resin, silicone and a combination thereof.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
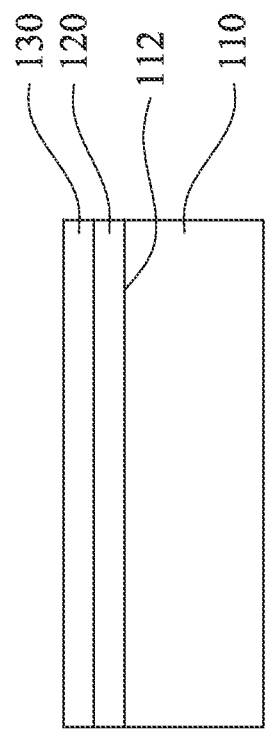
FIG. 1-3 are sectional views of light emitting structures according to various embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. A shape or a thickness of an embodiment may be enlarged to simplify the labeling in drawings, and a part of components may be described in words. It is understood that any component that is not drawn or described may be known by one of the skilled person in this art. The detailed description use a schematic sectional view to describe an ideal embodiment (and intermediate structures) of the present disclosure, and one of the skilled person in this art can understand that a method, a shape and/or a tolerance involved in the following embodiments can be reasonably changed. Therefore, the embodiment of the present disclosure does not limit the scope of the present invention.

FIG. 1 is a sectional view of a light emitting structure 100 according to one embodiment of the present disclosure. The light emitting structure 100 includes a blue light source 110, a first fluorescent material layer 120 and a second fluorescent material layer 130.

The blue light source 110 has a light emitting surface 112. In one embodiment of the present disclosure, the blue light source 110 includes but is not limited to a blue light emitting diode chip or a blue organic light emitting diode chip. In another embodiment of the present disclosure, the blue light emitting diode chip or the blue organic light emitting diode chip can be but is not limited to a horizontal light emitting diode chip, a vertical light emitting diode chip or a flip-chip light emitting diode chip.

The first fluorescent material layer 120 covers the light emitting surface 112 of the blue light source 110. The second fluorescent material layer 130 covers the first fluorescent material layer 120. It is mentioned that first fluorescent material layer 120 consists of a first fluorescent material, and an excitation band of the first fluorescent material is in a blue wave band, and an emission band of the first fluorescent material is in a green wave band. The second fluorescent material layer 130 consists of a second fluorescent material, an excitation band of the second fluorescent material is in the green wave band, and an emission band of the second fluorescent material is in a red wave band. In one embodiment of the present disclosure, an emission band of the blue light source 110 is partially overlapped with the excitation band of the first fluorescent material, and the emission band of the first fluorescent material is partially overlapped with the excitation band of the second fluorescent material. According to one embodiment of the present disclosure, the emission band of the blue light source 110 is about 350 nm to about 470 nm. According to one embodiment of the present disclosure, the excitation band of the first fluorescent material is about 350 nm to about 480 nm, and the emission band of the first fluorescent material is about 510 nm to about 580 nm. According to one embodiment of the present disclosure, the excitation band of the second fluorescent material is about 500 nm to about 600 nm, and the emission band of the second fluorescent material is about 600 nm to about 780 nm.

According to one embodiment of the present disclosure, the first fluorescent material is an inorganic fluorescent material selected from the group consisting of LuYAG, GaYAG, YAG, a silicate, a sulfide, a nitride, a quantum dot material and a combination thereof. According to one embodiment of the present disclosure, the second fluorescent material is an organic fluorescent material, the organic fluorescent material is an organic compound having a functional group selected from the group consisting of a perylene group, a benzimidazole group, a naphthalene group, an anthracene group, a phenanthrene group, a fluorene group, a 9-fluorenone group, a carbazole group, a glutarimide group, a 1,3-diphenylbenzene group, a benzopyrene group, a pyrene group, a pyridine group, a thiophene group, a 2,3-dihydro-1H-benzo[de]isoquinoline-1,3-dione group, and the organic compound comprises a single molecule structure, a polymolecule structure, an oligomer, a polymer and a combination thereof.

Figure 2:
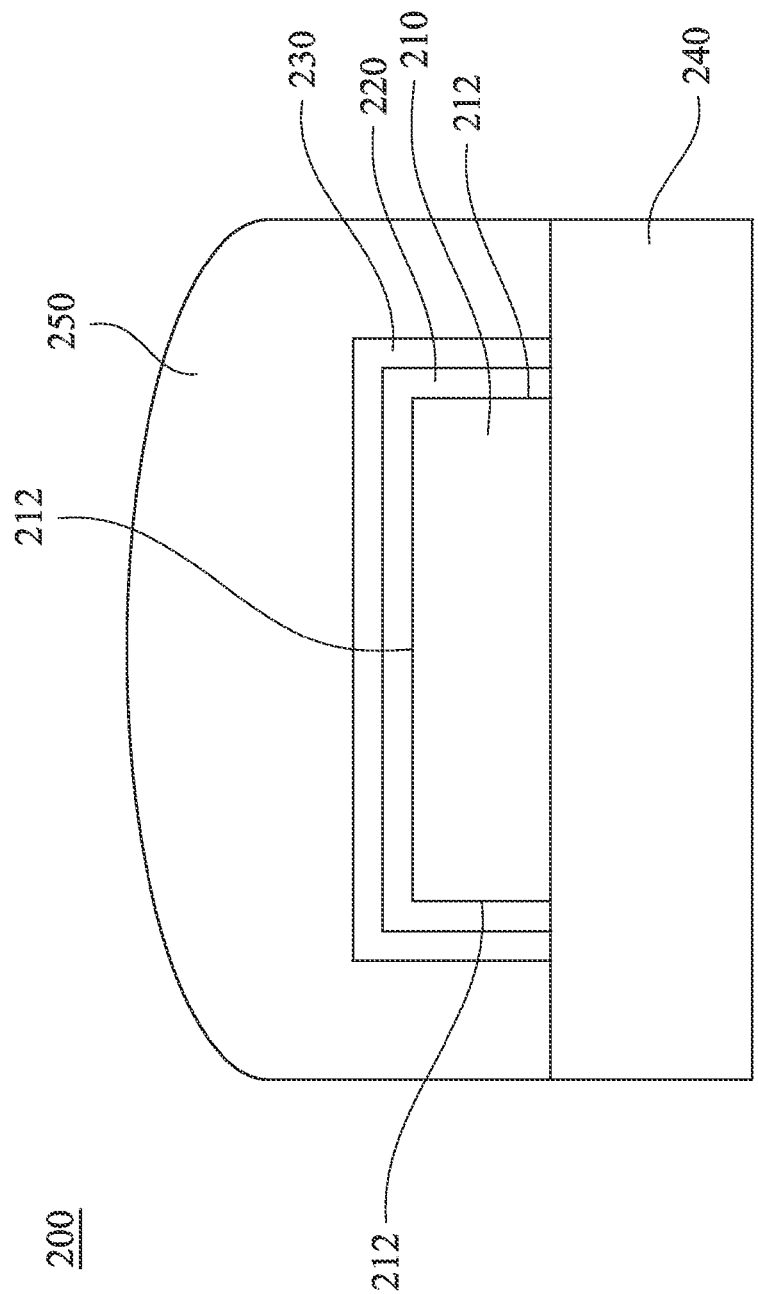

FIG. 2 is a sectional view of a light emitting structure 200 according to one embodiment of the present disclosure. The light emitting structure 200 includes a blue light source 210, a first fluorescent material layer 220 and a second fluorescent material layer 230.

A difference between the light emitting structure 100 of FIG. 1 and the light emitting structure 200 of FIG. 2 is that the light emitting structure 200 has several light emitting surfaces 212. The first fluorescent material layer 220 covers all of the light emitting surfaces 212 of the blue light source 210. The second fluorescent material layer 230 covers the first fluorescent material layer 220.

Besides, the light emitting structure 200 further includes a substrate 240, and the blue light source 210 is disposed on the substrate 240. As shown in FIG. 2, the light emitting structure 200 further includes a transparent packaging plastic material layer 250 covers the second fluorescent material layer 230. According to one embodiment of the present disclosure, a material of the transparent packaging plastic material layer 250 is selected from the group consisting of polymethylmethacrylate (PMMA), polyethylene terephthalate (PET), polystyrene (PS), polypropylene (PP), polyamide (PA), polycarbonate (PC), an epoxy resin, silicone and a combination thereof.

According to one embodiment of the present disclosure, the light emitting structure 100 of FIG. 1 may have a substrate and a transparent packaging plastic material layer, and the light emitting structure 100 of FIG. 1 has a similar structure to the light emitting structure 200 of FIG. 2.

Figure 3:
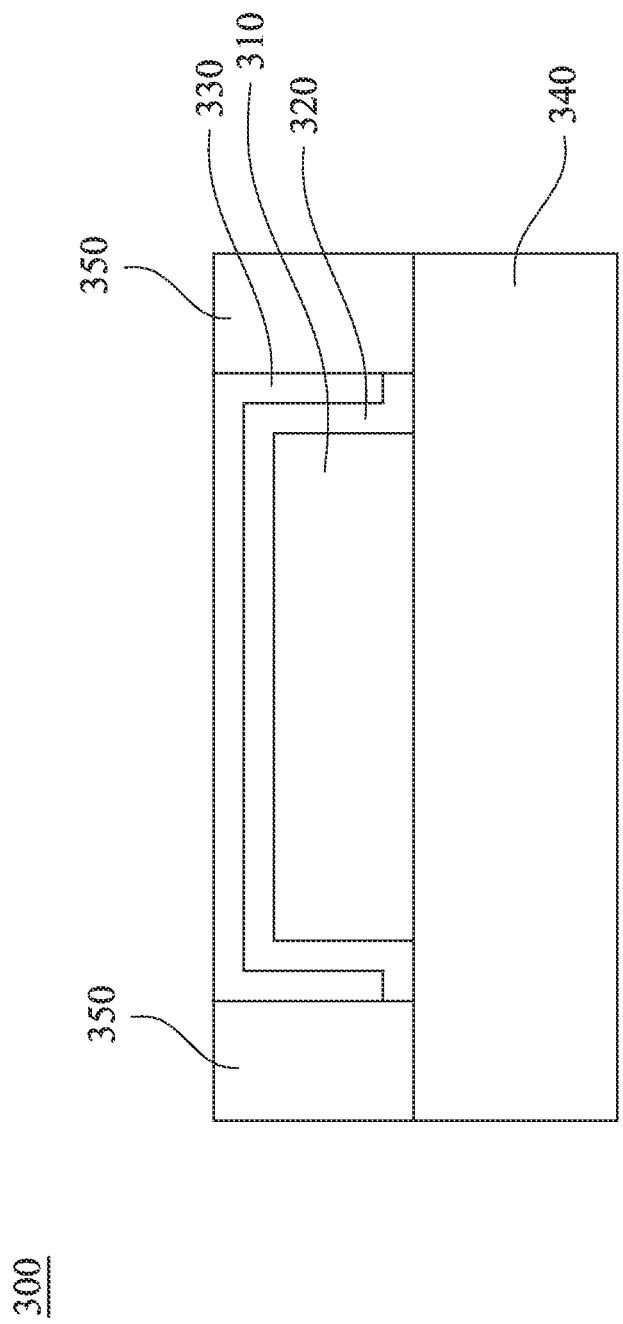

FIG. 3 is a sectional view of a light emitting structure 300 according to one embodiment of the present disclosure. The light emitting structure 300 includes a blue light source 310, a first fluorescent material layer 320, a second fluorescent material layer 330 and a substrate 340. The blue light source 310 is disposed on the substrate 340. The first fluorescent material layer 320 covers all of the light emitting surfaces of the blue light source 310. The second fluorescent material layer 330 covers the first fluorescent material layer 320.

A difference between the light emitting structure 200 of FIG. 2 and the light emitting structure 300 of FIG. 3 is that the light emitting structure 300 further includes a light-tight packaging plastic material layer 350 disposed on the substrate 340 and surrounding the blue light source 310. According to one embodiment of the present disclosure, the light-tight packaging plastic material layer includes a base and a pigment dispersed in the base. According to one embodiment of the present disclosure, a material of the base is selected from the group consisting of polymethylmethacrylate (PMMA), polyethylene terephthalate (PET), polystyrene (PS), polypropylene (PP), polyamide (PA), polycarbonate (PC), an epoxy resin, silicone and a combination thereof.

According to one embodiment of the present disclosure, the light emitting structure 100 may have a substrate and a light-tight packaging plastic material layer, and the light emitting structure 100 of FIG. 1 has a similar structure to the light emitting structure 300 of FIG. 3.

Figure 4:
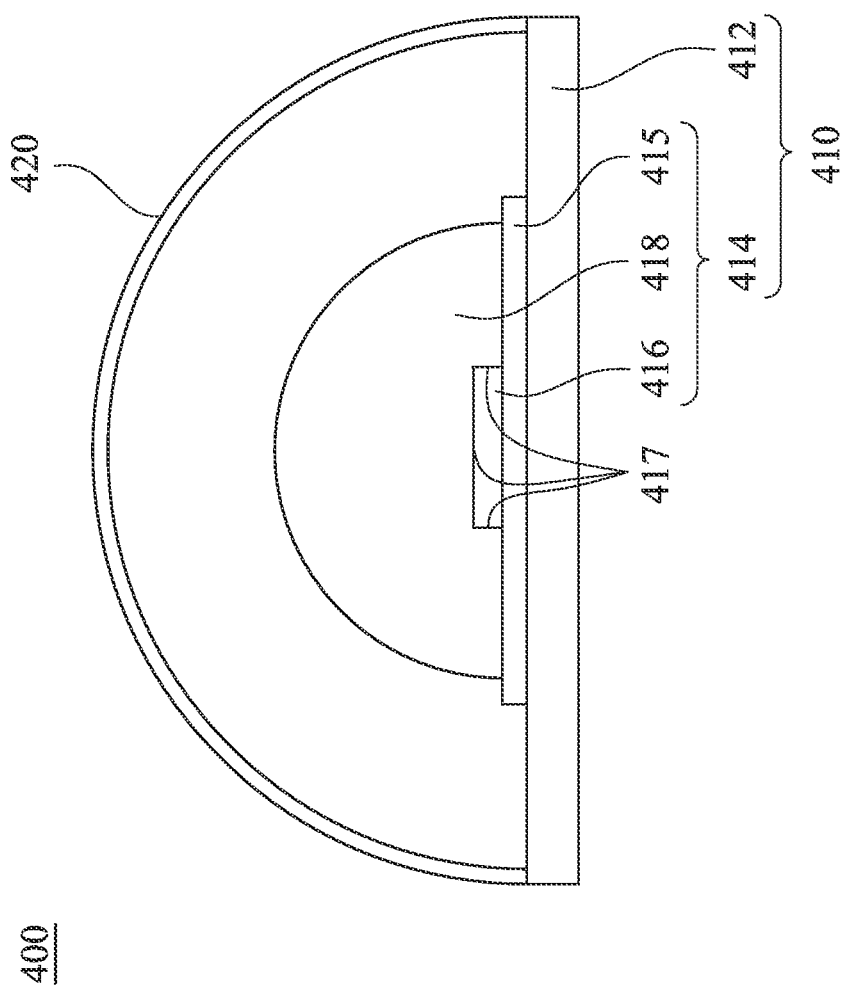
FIG. 4 is a sectional view of a light device according to one embodiment of the present disclosure.

FIG. 4 is a sectional view of a light device 400 according to one embodiment of the present disclosure. The light device 400 includes a light bar 410 and a fluorescent lampshade 420.

The light bar 410 includes a circuit board 412 and at least one light emitting structure 414. The light emitting structure 414 is disposed on and electrically connected to the circuit board 412, and the light emitting structure 414 includes a blue light source 416 and a fluorescent plastic material layer 418. The blue light source 416 has light emitting surfaces 417. According to one embodiment of the present disclosure, the emission band of the blue light source 416 is 350 nm to 470 nm. According to one embodiment of the present disclosure, the blue light source 416 includes but is not limited to a blue light emitting diode or a blue organic light emitting diode. According to one embodiment of the present disclosure, the blue light emitting diode or the blue organic light emitting diode includes but is not limited to a horizontal light emitting diode, a vertical light emitting diode or a flip-chip light emitting diode.

The fluorescent plastic material layer 418 covers the light emitting surfaces 417 of the blue light source 416. The fluorescent plastic material layer 418 includes a transparent plastic material and a first fluorescent material dispersed in the transparent plastic material, in which an excitation band of the first fluorescent material is in a blue wave band, and an emission band of the first fluorescent material is in a green wave band. According to one embodiment of the present disclosure, the excitation band of the first fluorescent material is 350 nm to 480 nm, and the emission band of the first fluorescent material is 510 nm to 580 nm. The first fluorescent material is an inorganic fluorescent material selected from the group consisting of LuYAG, GaYAG, YAG, a silicate, a sulfide, a nitride, a quantum dot material and a combination thereof. According to one embodiment of the present disclosure, an emission band of the blue light source 416 is partially overlapped with the excitation band of the first fluorescent material.

As shown in FIG. 4, the light emitting structure 414 further includes a substrate 415, and the blue light source 416 and the fluorescent plastic material layer 418 are both disposed on the substrate 415. According to one embodiment of the present disclosure, the blue light source 416 of the light emitting structure 414 is electrically connected to the circuit board 412 through the substrate 415.

The fluorescent lampshade 420 covers the light bar 410. The fluorescent lampshade 420 includes a lampshade body and a second fluorescent material dispersed in the lampshade body. An excitation band of the second fluorescent material is in the green wave band, and an emission band of the second fluorescent material is in a red wave band. According to one embodiment of the present disclosure, the excitation band of the second fluorescent material is 500 nm to 600 nm, and the emission band of the second fluorescent material is 600 nm to 780 nm. According to one embodiment of the present disclosure, the second fluorescent material is an organic fluorescent material, the organic fluorescent material is an organic compound having a functional group selected from the group consisting of a perylene group, a benzimidazole group, a naphthalene group, an anthracene group, a phenanthrene group, a fluorene group, a 9-fluorenone group, a carbazole group, a glutarimide group, a 1,3-diphenylbenzene group, a benzopyrene group, a pyrene group, a pyridine group, a thiophene group, a 2,3-dihydro-1H-benzo[de]isoquinoline-1,3-dione group, and the organic compound comprises a single molecule structure, a polymolecule structure, an oligomer, a polymer and a combination thereof. According to one embodiment of the present disclosure, the emission band of the first fluorescent material is partially overlapped with the excitation band of the second fluorescent material.

According to one embodiment of the present disclosure, the transparent plastic material and a material of the lampshade body are independently selected from the group consisting of polymethylmethacrylate (PMMA), polyethylene terephthalate (PET), polystyrene (PS), polypropylene (PP), polyamide (PA), polycarbonate (PC), an epoxy resin, silicone and a combination thereof.

Figure 5A:
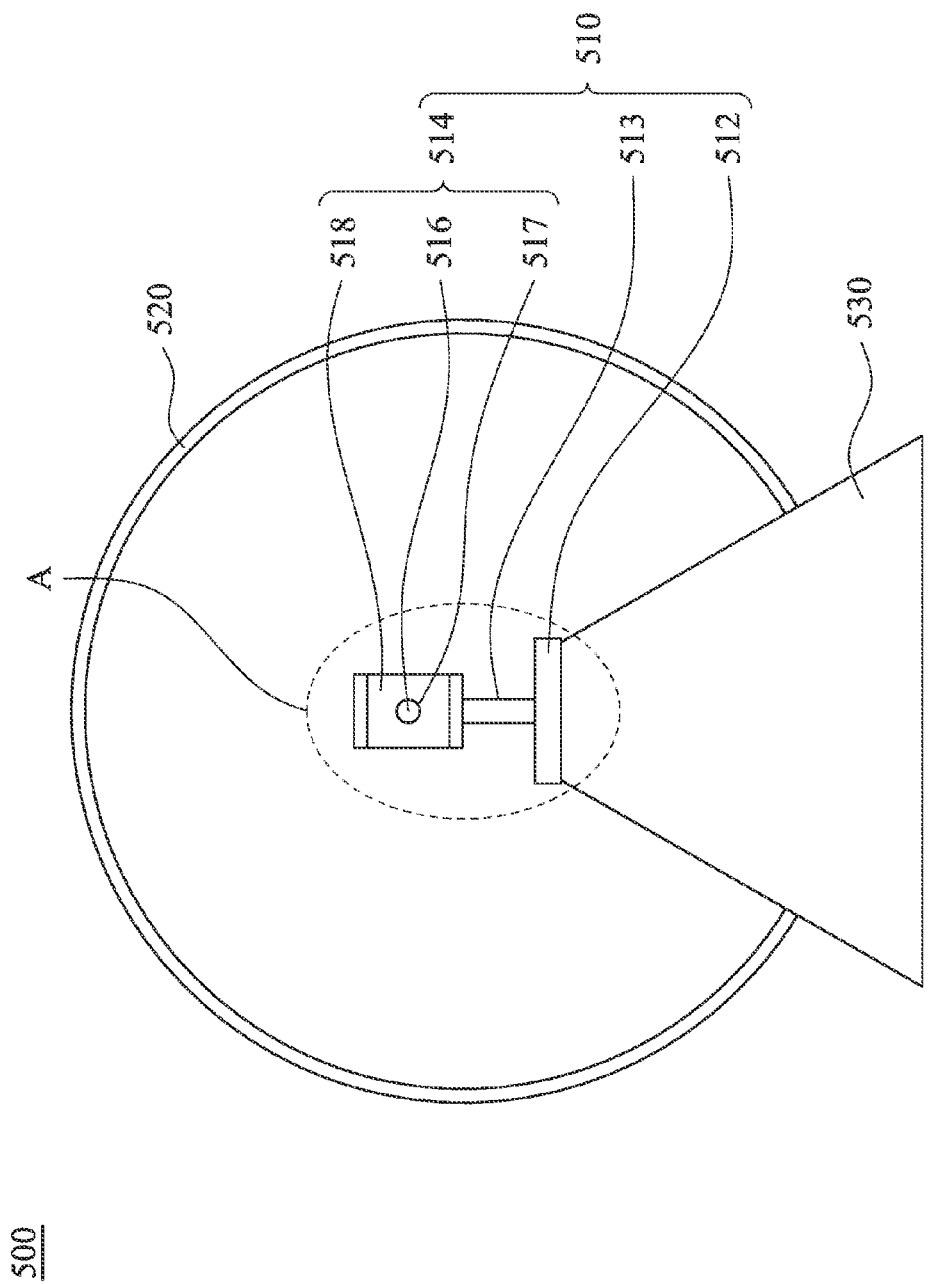
FIG. 5A is a sectional view of a light device according to one embodiment of the present disclosure.

FIG. 5A is a sectional view of a light device 500 according to one embodiment of the present disclosure. As shown in FIG. 5A, the light device 500 includes a light bar 510 and a fluorescent lampshade 520.

The light bar 510 includes a circuit board 512 and at least one light emitting structure 514. The light emitting structure 514 is disposed on and electrically connected to the circuit board 512. A difference between the light device 400 of FIG. 4 and the light device 500 of FIG. 5A is that the light device 500 further includes a pair of conductive supporting members 513, electrically connected to the light emitting structure 514 and the circuit board 512.

The light emitting structure 514 includes a blue light source 516 and a fluorescent plastic material layer 518. The blue light source 516 has a light emitting surface 517. According to one embodiment of the present disclosure, the blue light source 516 can be but is not limited to a vertical light emitting diode. The fluorescent plastic material layer 518 covers the light emitting surface 517 of the blue light source 516.

The fluorescent lampshade 520 covers the light bar 510. As shown in FIG. 5A, the light device 500 further includes a base 530, and the light bar 510 and the fluorescent lampshade 520 are both disposed on the base 530. According to one embodiment of the present disclosure, the base 530 is a heat dissipation base to dissipate heat produced from the emitted light of the light bar 510, so as to reduce a temperature of the light device 500. In the embodiment of the present disclosure, the kinds, amounts, ingredients and compositions of the blue light source 516, the fluorescent plastic material layer 518 and the fluorescent lampshade 520 of the light device 500 are the same as all those of the light device 400, thus a detailed structure, kinds of materials, wave bands of an excitation band and an emission band, and effects of the light device 500 are not further described repetitively.

Figure 5B:
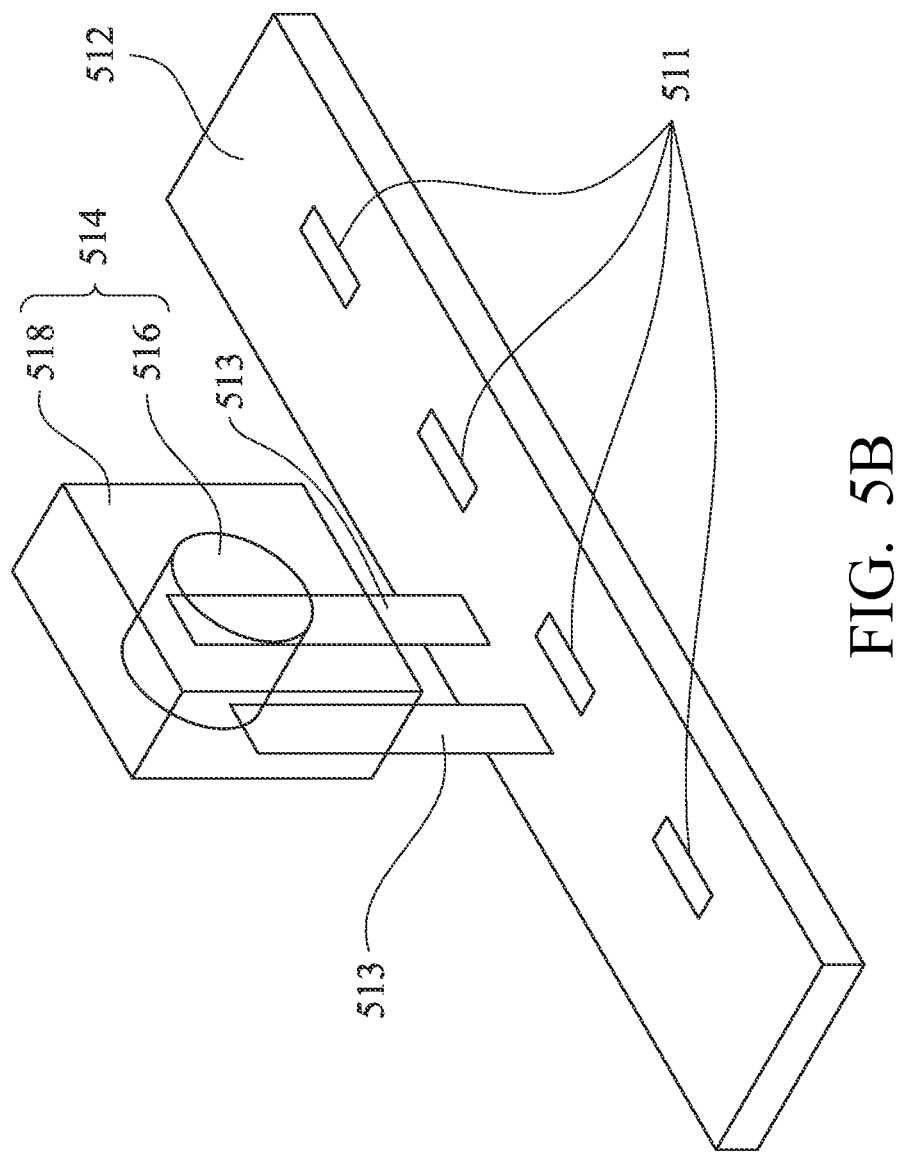
FIG. 5B is a view of partial enlargement of FIG. 5A.

Please refer to FIG. 5B, FIG. 5B is a view of partial enlargement of a region A in FIG. 5A. As shown in FIG. 5B, a pair of conductive supporting members 513 are two metal sheets, each of which is connected to one of two electrodes (not shown) of the light emitting structure 514 respectively, thereby forming a plug-in light emitting diode. In FIG. 5B, the circuit board 512 has several hubs 511, and the plug-in light emitting diode is directly plugged into and electrically connected to the hubs 511 of the circuit board 512 by the pair of the conductive supporting members 513.

Figure 6:
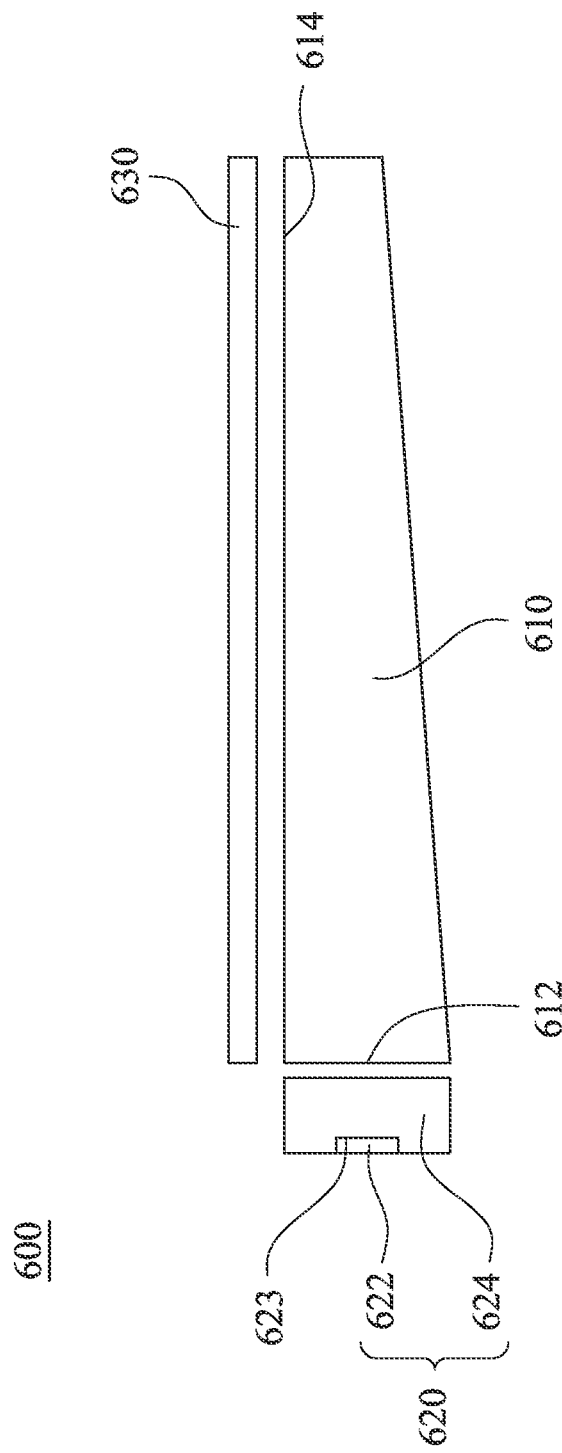
FIG. 6-8 are sectional views of backlight modules according to various embodiments of the present disclosure.

FIG. 6 is a sectional view of a backlight module 600 according to one embodiment of the present disclosure. As shown in FIG. 6, the backlight module 600 includes an optical device 610, a light emitting structure 620 and a fluorescent material layer 630.

The optical device 610 has an incident surface 612 and a light emitting surface 614. According to one embodiment of the present disclosure, the optical device 610 includes a light guide plate, a lens or a combination thereof. According to one embodiment of the present disclosure, the incident surface 612 and the light emitting surface 614 of the light guide plate are adjacent to or opposite to each other. In FIG. 6, the optical device 610 is the light guide plate, and the incident surface 612 of the light guide plate is adjacent to the light emitting surface 614 of the same.

The light emitting structure 620 emits light toward the incident surface 612 of the optical device 610, and the light emitting structure 620 includes a blue light source 622 and a fluorescent plastic material layer 624.

The blue light source 622 has a light emitting surface 623. According to one embodiment of the present disclosure, the emission band of the blue light source 622 is about 350 nm to about 470 nm. According to one embodiment of the present disclosure, the blue light source 622 includes but is not limited to a blue light emitting diode chip or a blue organic light emitting diode chip. The blue light emitting diode chip or the blue organic light emitting diode chip includes but is not limited to a horizontal light emitting diode chip, a vertical light emitting diode chip or a flip-chip light emitting diode chip.

The fluorescent plastic material layer 624 covers the light emitting surface 623 of the blue light source 622. The fluorescent plastic material layer 624 includes a transparent plastic material and a first fluorescent material dispersed in the transparent plastic material. According to one embodiment of the present disclosure, the transparent plastic material is selected from the group consisting of polymethylmethacrylate (PMMA), polyethylene terephthalate (PET), polystyrene (PS), polypropylene (PP), polyamide (PA), polycarbonate (PC), an epoxy resin, silicone and a combination thereof.

An excitation band of the first fluorescent material is in a blue wave band, and an emission band of the first fluorescent material is in a green wave band. According to one embodiment of the present disclosure, the excitation band of the first fluorescent material is about 350 nm to about 480 nm, and the emission band of the first fluorescent material is about 510 nm to about 580 nm. The first fluorescent material is an inorganic fluorescent material selected from the group consisting of LuYAG, GaYAG, YAG, a silicate, a sulfide, a nitride, a quantum dot material and a combination thereof. According to one embodiment of the present disclosure, an emission band of the blue light source 622 is partially overlapped with the excitation band of the first fluorescent material.

The fluorescent material layer 630 covers the light emitting surface 614 of the optical device 610, and the fluorescent material layer 630 includes a second fluorescent material. An excitation band of the second fluorescent material is in the green wave band, and an emission band of the second fluorescent material is in a red wave band. According to one embodiment of the present disclosure, the excitation band of the second fluorescent material is about 500 nm to about 600 nm, and the emission band of the second fluorescent material is about 600 nm to about 780 nm. According to one embodiment of the present disclosure, the emission band of the first fluorescent material is partially overlapped with the excitation band of the second fluorescent material. According to one embodiment of the present disclosure, the second fluorescent material is an organic fluorescent material, the organic fluorescent material is an organic compound having a functional group selected from the group consisting of a perylene group, a benzimidazole group, a naphthalene group, an anthracene group, a phenanthrene group, a fluorene group, a 9-fluorenone group, a carbazole group, a glutarimide group, a 1,3-diphenylbenzene group, a benzopyrene group, a pyrene group, a pyridine group, a thiophene group, a 2,3-dihydro-1H-benzo[de]isoquinoline-1,3-dione group, and the organic compound comprises a single molecule structure, a polymolecule structure, an oligomer, a polymer and a combination thereof.

Figure 7:
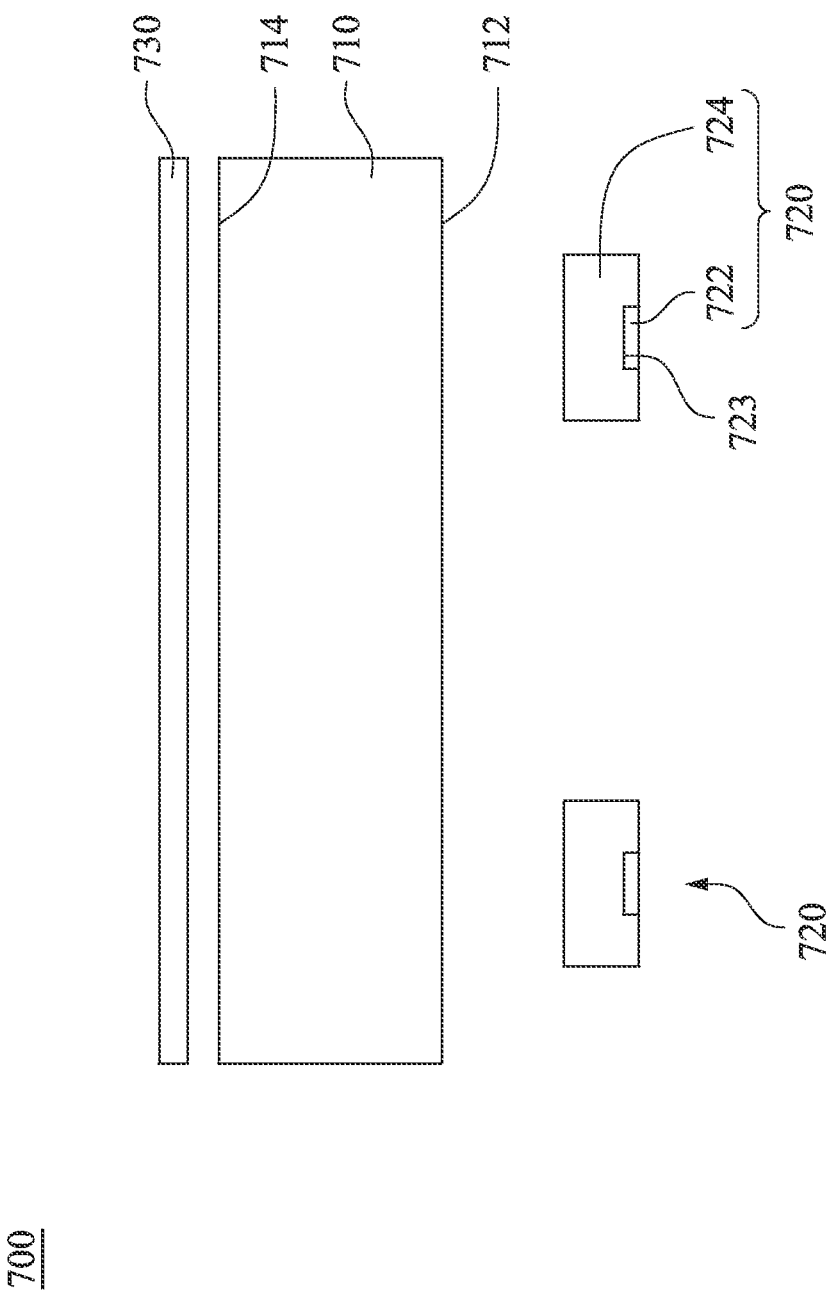

FIG. 7 is a sectional view of a backlight module 700 according to one embodiment of the present disclosure. As shown in FIG. 7, the backlight module 700 includes an optical device 710, a light emitting structure 720 and a fluorescent material layer 730.

The optical device 710 has an incident surface 712 and a light emitting surface 714. In FIG. 7, the optical device 710 is a light guide plate, and the incident surface 712 of the light guide plate is opposite to the light emitting surface 714 of the same.

The light emitting structure 720 emits light toward the incident surface 712 of the optical device 710. The light emitting structure 720 includes a blue light source 722 and a fluorescent plastic material layer 724. The blue light source 722 has a light emitting surface 723. The fluorescent plastic material layer 724 covers the light emitting surface 723 of the blue light source 722. The fluorescent material layer 730 covers the light emitting surface 714 of the optical device 710.

In the embodiment of the present disclosure, the kinds, amounts, ingredients and the compositions of the blue light source 722, the fluorescent plastic material layer 724 and the fluorescent material layer 730 of the backlight module 700 are the same as all those of the backlight module 600, thus a detailed structure, kinds of materials, wave bands of an excitation band and an emission band, and effects of the backlight module 700 are not further described repetitively.

Figure 8:
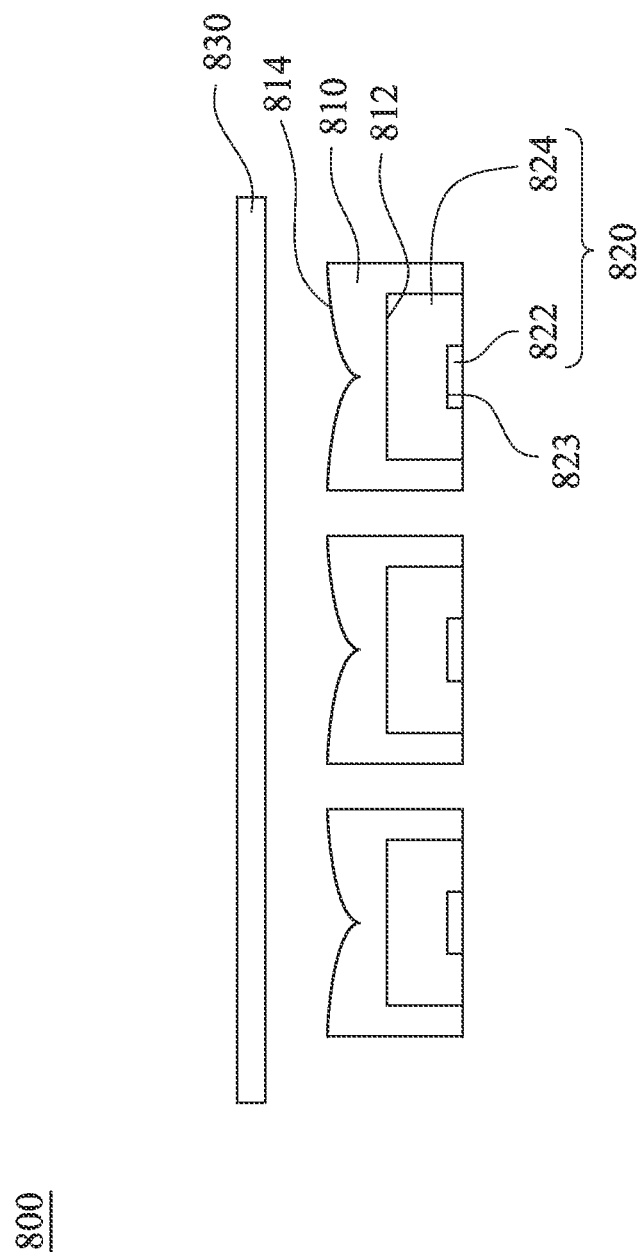

FIG. 8 is a sectional view of a backlight module 800 according to one embodiment of the present disclosure. As shown in FIG. 8, the backlight module 800 includes an optical device 810, a light emitting structure 820 and a fluorescent material layer 830.

The optical device 810 has an incident surface 812 and a light emitting surface 814. As shown in FIG. 8, the optical device 810 is a lens, for example, the optical device 810 can be but is not limited to a secondary optical lens.

The light emitting structure 820 emits light toward the incident surface 812 of the optical device 810. The light emitting structure 820 includes a blue light source 822 and a fluorescent plastic material layer 824. The blue light source 822 has a light emitting surface 823. The fluorescent plastic material layer 824 covers the light emitting surface 823 of the blue light source 822. The fluorescent material layer 830 covers the light emitting surface 814 of the optical device 810. In FIG. 8, the fluorescent material layer 830 covers the light emitting surface 814 of the secondary optical lens.

In the embodiment of the present disclosure, the kinds, amounts, ingredients and the compositions of the blue light source 822, the fluorescent plastic material layer 824 and the fluorescent material layer 830 of the backlight module 800 are the same as all those of the backlight module 600, thus a detailed structure, kinds of materials, wave bands of an excitation band and an emission band, and effects are not further described repetitively.

The present disclosure discloses a new light emitting structure, a light device and a backlight module having the same. A fluorescent material layer emitting a green light and a fluorescent material layer emitting a red light orderly cover a light emitting surface of a blue light source of the light emitting structure. The fluorescent material layer emitting the green light and the fluorescent material layer emitting the red light provided by the present disclosure are independently disposed in the light emitting structure, thus an effect of mutual absorption between a fluorescent particle emitting the green light and a fluorescent particle emitting the red light in the prior structure is prevented. On the other hand, the fluorescent material layer emitting the green light absorbs a blue light and excites the green light, and the fluorescent material layer emitting the red light absorbs the green light and excites the red light, thus a reabsorption effect resulting from absorbing the same wave band of a color light is prevented.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light device, comprising:
   a light bar, comprising:
   a circuit board; and
   at least one light emitting structure, disposed on and electrically connected to the circuit board, wherein the light emitting structure comprises:
   a blue light source, having a light emitting surface, and
   a fluorescent plastic material layer, covering the light emitting surface of the blue light source, wherein the fluorescent plastic material layer comprises a transparent plastic material and a first fluorescent material dispersed in the transparent plastic material, an excitation band of the first fluorescent material is a in blue wave band, and an emission band of the first fluorescent material is in a green wave band;
   a fluorescent lampshade, covering the light bar, wherein the fluorescent lampshade comprises a lampshade body and a second fluorescent material dispersed in the lampshade body, an excitation band of the second fluorescent material is in the green wave band, and an emission band of the second fluorescent material is in a red wave band; and
   a pair of conductive supporting members, electrically connected to the light emitting structure and the circuit board.

2. The light device of claim 1, wherein an emission band of the blue light source is partially overlapped with the excitation band of the first fluorescent material, and the emission band of the first fluorescent material is partially overlapped with the excitation band of the second fluorescent material.

3. The light device of claim 1, wherein the emission band of the blue light source is 350 nm to 470 nm.

4. The light device of claim 1, wherein the blue light source comprises a blue light emitting diode or a blue organic light emitting diode.

5. The light device of claim 4, wherein the blue light emitting diode or the blue organic light emitting diode comprises a horizontal light emitting diode, a vertical light emitting diode or a flip-chip light emitting diode.

6. The light device of claim 1, wherein the excitation band of the first fluorescent material is 350 nm to 480 nm, and the emission band of the first fluorescent material is 510 nm to 580 nm.

7. The light device of claim 1, wherein the first fluorescent material is an inorganic fluorescent material selected from the group consisting of LuYAG, GaYAG, YAG, a silicate, a sulfide, a nitride, a quantum dot material and a combination thereof.

8. The light device of claim 1, wherein the excitation band of the second fluorescent material is 500 nm to 600 nm, and the emission band of the second fluorescent material is 600 nm to 780 nm.

9. The light device of claim 1, wherein the second fluorescent material is an organic fluorescent material, the organic fluorescent material is an organic compound having a functional group selected from the group consisting of a perylene group, a benzimidazole group, a naphthalene group, an anthracene group, a phenanthrene group, a fluorene group, a 9-fluorenone group, a carbazole group, a glutarimide group, a 1,3-diphenylbenzene group, a benzopyrene group, a pyrene group, a pyridine group, a thiophene group, a 2,3-dihydro-1H-benzo[de]isoquinoline-1,3-dione group, and the organic compound comprises a single molecule structure, a polymolecule structure, an oligomer, a polymer and a combination thereof.

10. The light device of claim 1, wherein the transparent plastic material and a material of the lampshade body are independently selected from the group consisting of polymethylmethacrylate (PMMA), polyethylene terephthalate (PET), polystyrene (PS), polypropylene (PP), polyamide (PA), polycarbonate (PC), an epoxy resin, silicone and a combination thereof.

11. The light device of claim 1, wherein the pair of the conductive supporting members are two metal sheets, each of which is connected to one of two electrodes of the light emitting structure respectively, thereby forming a plug-in light emitting diode.

12. The light device of claim 11, wherein the plug-in light emitting diode is directly plugged in and electrically connected to the circuit board.

13. A backlight module, comprising:
an optical device, having an incident surface and a light emitting surface, wherein the optical device comprises a light guide plate, a lens or a combination thereof;
a light emitting structure, emitting light toward the incident surface of the optical device, wherein the light emitting structure comprises:
a blue light source, having a light emitting surface; and
a fluorescent plastic material layer, covering the light emitting surface of the blue light source, wherein the fluorescent plastic material layer comprises a transparent plastic material and a first fluorescent material dispersed in the transparent plastic material, an excitation band of the first fluorescent material is in a blue wave band, and an emission band of the first fluorescent material is in a green wave band; and
a fluorescent material layer, covering the light emitting surface of the optical device, wherein the fluorescent material layer comprises a second fluorescent material, an excitation band of the second fluorescent material is the in green wave band, and an emission band of the second fluorescent material is in a red wave band,
wherein the lens is a secondary optical lens, the fluorescent material layer covers the light emitting surface of the secondary optical lens; or, the incident surface and the light emitting surface of the light guide plate are adjacent to or opposite to each other.

14. The backlight module of claim 13, wherein an emission band of the blue light source is partially overlapped with the excitation band of the first fluorescent material, and the emission band of the first fluorescent material is partially overlapped with the excitation band of the second fluorescent material.

15. The backlight module of claim 13, wherein the emission band of the blue light source is 350 nm to 470 nm.

16. The backlight module of claim 13, wherein the blue light source comprises a blue light emitting diode chip or a blue organic light emitting diode chip.

17. The backlight module of claim 16, wherein the blue light emitting diode chip or the blue organic light emitting diode chip comprises a horizontal light emitting diode chip, a vertical light emitting diode chip or a flip-chip light emitting diode chip.

18. The backlight module of claim 13, wherein the excitation band of the first fluorescent material is 350 nm to 480 nm, and the emission band of the first fluorescent material is 510 nm to 580 nm.

19. The backlight module of claim 13, wherein the first fluorescent material is an inorganic fluorescent material selected from the group consisting of LuYAG, GaYAG, YAG, a silicate, a sulfide, a nitride, a quantum dot material and a combination thereof.

20. The backlight module of claim 13, wherein the excitation band of the second fluorescent material is 500 nm to 600 nm, and the emission band of the second fluorescent material is 600 nm to 780 nm.

21. The backlight module of claim 13, wherein the second fluorescent material is an organic fluorescent material, the organic fluorescent material is an organic compound having a functional group selected from the group consisting of a perylene group, a benzimidazole group, a naphthalene group, an anthracene group, a phenanthrene group, a fluorene group, a 9-fluorenone group, a carbazole group, a glutarimide group, a 1,3-diphenylbenzene group, a benzopyrene group, a pyrene group, a pyridine group, a thiophene group, a 2,3-dihydro-1H-benzo[de]isoquinoline-1,3-dione group, and the organic compound comprises a single molecule structure, a polymolecule structure, an oligomer, a polymer and a combination thereof.

22. The backlight module of claim 13, wherein the transparent plastic material is selected from the group consisting of polymethylmethacrylate (PMMA), polyethylene terephthalate (PET), polystyrene (PS), polypropylene (PP), polyamide (PA), polycarbonate (PC), an epoxy resin, silicone and a combination thereof.

* * * * *

UNITED STATES PATENT AND TRADEMARK OFFICE
CERTIFICATE OF CORRECTION

Page 1 of 1

PATENT NO. : 9,966,505 B2
APPLICATION NO. : 14/887451
DATED : May 8, 2018
INVENTOR(S) : Ching-Yi Chen et al.

It is certified that error appears in the above-identified patent and that said Letters Patent is hereby corrected as shown below:

In the Claims

At Column 12, Line 52, in Claim 1:
"band of the first fluorescent material is a in" should be "band of the first fluorescent material is in a"

Signed and Sealed this
Second Day of October, 2018

Andrei Iancu
*Director of the United States Patent and Trademark Office*